(12) United States Patent
Arlt et al.

(10) Patent No.: US 12,023,706 B2
(45) Date of Patent: Jul. 2, 2024

(54) SYSTEMS AND METHODS FOR COMBINED RADIATION AND FUNCTIONAL LAYER APPLICATION (71) Applicant: Esko-Graphics Imaging GmbH, Itzehoe (DE)

(72) Inventors: Klaus Walter Arlt, Itzehoe (DE); Wolfgang Sievers, Kremperheide (DE)

(73) Assignee: Esko-Graphics Imaging GmbH (DE)

( * ) Notice: Subject to any disclaimer, the term of this patent is extended or adjusted under 35 U.S.C. 154(b) by 354 days.

(21) Appl. No.: 16/972,293

(22) PCT Filed: Jun. 5, 2020

(86) PCT No.: PCT/EP2020/065676
§ 371 (c)(1),
(2) Date: Dec. 4, 2020

(87) PCT Pub. No.: WO2020/245393
PCT Pub. Date: Dec. 10, 2020

(65) Prior Publication Data
US 2022/0184652 A1 Jun. 16, 2022

Related U.S. Application Data (60) Provisional application No. 62/857,456, filed on Jun. 5, 2019.

(51) Int. Cl.
*B32B 37/00* (2006.01)
*B05C 9/12* (2006.01)
(Continued)

(52) U.S. Cl.
CPC ............... *B05C 9/12* (2013.01); *B05D 1/02* (2013.01); *B05D 3/06* (2013.01); *B32B 37/0053* (2013.01);
(Continued)

(58) Field of Classification Search
CPC .... B05C 9/12; B05C 9/14; B05D 1/02; B05D 3/06; B32B 37/0053; B32B 38/0004;
(Continued)

(56) References Cited

U.S. PATENT DOCUMENTS 5,228,920 A   7/1993   Thompson
5,262,275 A   11/1993  Fan
(Continued)

FOREIGN PATENT DOCUMENTS

EP      3130466 A2    2/2017
JP      2004338304  * 12/2004
(Continued)

OTHER PUBLICATIONS

JP-2004338304 Machine Translation of Description (Year: 2023).*
(Continued)

*Primary Examiner* — Cynthia L Schaller
(74) *Attorney, Agent, or Firm* — Buchanan Ingersoll & Rooney PC (57) ABSTRACT A combined radiation and functional layer application system includes one or more radiation sources and a commonly located functional layer application unit configured to dispose a functional layer over the surface of a fixed target ahead of the radiation sources during relative motion between the target and the radiation sources/application unit. System and method embodiments include those in which the target is stationary or moving, and embodiments in which the functional layer is applied as a liquid or as a solid laminate. Embodiments relate to application of an oxygen-blocking layer of a printing plate prior to exposure to actinic radiation. Certain solid laminate embodiments include a two-roll system for positioning the laminate for cutting adjacent a trailing edge of the plate.

25 Claims, 7 Drawing Sheets (51) Int. Cl.
*B05D 1/02* (2006.01)
*B05D 3/06* (2006.01)
*B32B 38/00* (2006.01)
*B32B 38/18* (2006.01)

(52) U.S. Cl.
CPC ...... *B32B 38/0004* (2013.01); *B32B 38/0008* (2013.01); *B32B 38/1816* (2013.01); *B32B 2310/0831* (2013.01); *B32B 2310/0837* (2013.01)

(58) Field of Classification Search
CPC ............ B32B 38/0008; B32B 38/1816; B32B 2310/0831; B32B 2310/0837; G03F 7/16; G03F 7/161; G03F 7/201; G03F 7/202; G03F 7/2035; G03F 7/092
See application file for complete search history.

(56) References Cited

U.S. PATENT DOCUMENTS

| | | | |
|---|---|---|---|
| 6,180,325 | B1 | 1/2001 | Gelbart |
| 8,227,769 | B2 | 7/2012 | Sievers |
| 8,389,203 | B2 | 3/2013 | Sievers |
| 8,492,074 | B2 | 7/2013 | Bryant |
| 8,524,442 | B1 | 9/2013 | Recchia et al. |
| 8,669,041 | B2 | 3/2014 | Cook et al. |
| 8,697,337 | B2 | 4/2014 | Roshelli et al. |
| 8,772,740 | B2 | 7/2014 | Klein et al. |
| 8,871,431 | B2 | 10/2014 | Gotsick et al. |
| 9,223,218 | B2 | 12/2015 | Vest et al. |
| 9,789,679 | B2 | 10/2017 | Stebani et al. |
| 9,925,757 | B2 | 3/2018 | Vest et al. |
| 2009/0226841 | A1 | 9/2009 | Kamitani et al. |
| 2010/0218898 | A1* | 9/2010 | Zwadlo ................. G03F 7/2014 156/580 |
| 2013/0071786 | A1 | 3/2013 | Oohashi |
| 2013/0209939 | A1 | 8/2013 | Recchia et al. |
| 2014/0261029 | A1 | 9/2014 | Oleson |
| 2018/0126721 | A1 | 5/2018 | Boyksen |
| 2018/0170088 | A1 | 6/2018 | Beyer et al. |
| 2018/0210345 | A1 | 7/2018 | Wolterink et al. |

FOREIGN PATENT DOCUMENTS

| | | | |
|---|---|---|---|
| WO | 2017056763 | A1 | 4/2017 |
| WO | WO-2017072588 | A2 * | 5/2017 ........... G03F 7/2004 |

OTHER PUBLICATIONS

International Search Report and Written Opinion for International Application No. PCT/EP2020/065676, dated Oct. 7, 2020, 18 pages.
Chinese Office Action with Search Report for Chinese Application No. 202080003673.6, dated Aug. 31, 2023 with translation, 31 pages.

* cited by examiner

SYSTEMS AND METHODS FOR COMBINED RADIATION AND FUNCTIONAL LAYER APPLICATION

CROSS-REFERENCE TO RELATED APPLICATIONS

This patent application is a U.S. National Phase Patent Application of PCT Application No. PCT/EP2020/065676, filed Jun. 5, 2020, which claims priority to U.S. Provisional Patent Application Ser. No. 62/857,456, filed Jun. 5, 2019, titled SYSTEMS AND METHODS FOR COMBINED RADIATION AND FUNCTIONAL LAYER APPLICATION, incorporated by reference herein in its entirety for all purposes.

BACKGROUND OF THE INVENTION

Radiation-curable polymer printing plates having a Laser Ablative Mask System (LAMS) layer are well known in the art. The LAMS layer is typically ablated in accordance with an image pattern, leaving gaps in the LAMS layer such that when actinic radiation, typically radiation in the ultraviolet (UV) spectrum, is applied to the plate, polymer in the gaps is exposed to the actinic radiation and cured. Later processing (e.g. a washing step) removes the remaining LAMS layer and uncured sections of the plate polymer thereunder, leaving an array of "dots" on the plate configured to hold printing ink.

It is also known that the absence of oxygen during UV curing of such printing plates is desirable for creating flattop screen structures on a polymer printing plate. One way to create an absence of oxygen is to place an oxygen blocking foil on the photopolymer plate during the curing step. One proprietary prior art system uses the oxygen blocking foil as the image-carrying layer, but is commercially available only for use with a dedicated film and imager. Others have disclosed laminating such an oxygen-blocking foil onto the LAMS layer of a photopolymer plate, which provides a more open system allowing the use of many different types of polymer plates, LAMS layers, and imagers.

The systems described above, such as made by Kodak or MacDermid, typically use so-called "bank exposure units" incorporating fluorescent tubes for providing the actinic radiation in the UV range. The use of other types of UV radiation sources in the field of exposing printing plates is also known, such as for example, as disclosed in U.S. Pat. No. 8,389,203, titled "EXPOSING PRINTING PLATES USING LIGHT EMITTING DIODES, assigned to the common assignee of the present invention, and incorporated herein by reference in its entirety." Providing UV exposure of a plate with a time delay between a back exposure step and a front exposure step is described generally in U.S. Published Patent Application No. US2018/0210345A1 ("the '345 Publication"), titled "PROCESS AND APPARATUS FOR CONTROLLED EXPOSURE OF FLEXOGRAPHIC PRINTING PLATES AND ADJUSTING THE FLOOR THEREOF," which is also assigned to the common assignee of the present invention and incorporated herein by reference in its entirety. Systems for implementing LED UV exposure systems such as those described in the '345 Publication are commercially available in the ESKO® XPS Crystal™ line or products.

LED sources typically have such high intensities that flattop dots can be created even without the help of an oxygen-blocking barrier. However, using an oxygen-blocking layer in conjunction with LED exposure sources offers the advantage of reducing the irradiance required for plate exposure as compared to exposure without oxygen blocking layer. Thus, providing systems configured to apply an oxygen-blocking layer prior to an LED source exposure step may have certain advantages.

SUMMARY OF THE INVENTION

One aspect of the invention comprises a combined radiation and functional layer application system. One or more radiation sources are configured to emit radiation toward a surface of a fixed target having a leading edge and a trailing edge. A functional layer application unit commonly located with the one or more radiation sources is configured to dispose the functional layer over the surface of the fixed target as the one or more radiation sources and commonly located functional layer application unit traverse relative to the target. The one or more radiation sources and commonly located functional layer application unit are configured to traverse relative to the fixed target in a first direction moving from the leading edge to the trailing edge, with the functional layer application unit positioned to apply a functional layer to the target ahead of the one or more radiation sources in the first direction. In preferred embodiments, the target comprises a printing plate curable by actinic radiation, the functional layer comprises an oxygen-blocking layer, and the one or more radiation sources comprise sources of the actinic radiation. In specific embodiments, the one or more radiation sources comprises an bank of UV LED sources arranged in a linear configuration perpendicular to the first direction, and the means for causing the one or more radiation sources and commonly located functional layer application unit to traverse relative to the target in the first direction comprises a movable carriage to which the one or more radiation sources and the functional layer application unit are mounted.

In some embodiments, the functional layer application unit may comprise a coating unit configured to apply the functional layer in a liquid form onto the target surface, such as in the form of a spray coating.

In other embodiments, the functional layer application unit comprises a lamination unit configured to apply the functional layer as a solid laminate. In solid laminate units, the lamination unit may comprise a laminate supply unit configured to feed the solid laminate over the target surface as the one or more radiation sources and commonly located lamination unit traverse relative to the target; and a pressure applicator, such as a roller, configured to apply the solid laminate to the target surface as the one or more radiation sources and commonly located lamination unit traverse relative to the target. The laminate supply unit may comprise a holder configured to hold a spool of laminate, having has an axis disposed perpendicular to the direction of travel, and pressure applicator roller also having an axis disposed perpendicular to the direction of travel. A cutter, such as a blade configured to travel perpendicular to the direction of travel of the lamination unit during application of the laminate, is configured to cut the solid laminate adjacent the trailing edge of the target.

In some embodiments, a second roller, which may have a different cross sectional diameter from the pressure applicator roller, may be disposed adjacent the pressure applicator roller and having an axis parallel to the pressure applicator roller axis, with the pressure applicator roller and second roller configured to receive the laminate therebetween during operation of the system. In a first configuration, the pressure applicator roller axis is located ahead of the second roller axis in the direction of travel as the laminate is applied, and in a second configuration, the second roller axis is located ahead of the pressure applicator roller axis in the direction of travel. The pressure applicator roller and the second roller may be mounted to a rack that is rotatable between the first configuration and the second configuration.

In some embodiments, a laminate take-up unit, which may have a fixed position relative to the functional layer application unit, may be configured to retrieve the solid laminate from the target surface after the one or more radiation sources and commonly located lamination unit traverse relative to the target. A second pressure applicator positioned between a trailing radiation source and the laminate take-up unit may be configured to keep the foil in contact with the mask upstream of the take-up unit. The functional layer application unit has variable position, and in some embodiments, a cutter is configured to cut the solid laminate adjacent the trailing edge of the target. In other embodiments, the functional layer application unit may have a variable position, with a temporary stationary position located downstream of a trailing end of the plate. In this embodiment, the system is configured to secure the functional layer application unit in the temporary stationary position after a foil application pass, conduct one or more exposure passes after the foil application pass, and then retrieve the functional layer application unit following a final exposure pass.

Another aspect of the invention is a method for preparing a printing plate. The method comprises providing a combined radiation/functional layer application unit comprising one or more radiation sources configured to emit radiation, and a functional layer application unit commonly located with the one or more radiation sources, the functional layer application unit comprising a functional layer supply unit having a supply of an oxygen-blocking functional layer. A printing plate is fixed relative to the combined radiation and functional layer application unit with a surface oriented to receive radiation from the one or more radiation sources and the functional layer from the functional layer application unit. The combined radiation and functional layer application unit move in a first direction relative to the fixed printing plate while applying the functional layer over the printing plate surface from the functional layer supply unit and then exposing the printing plate through the functional layer to the radiation emitted from the one or more radiation sources. In some embodiments, the method may comprise applying the functional layer over the printing plate surface comprises dispensing the coating as a liquid coating, such as by spraying the coating. In other embodiments, the functional layer application unit comprises a lamination unit and the combined radiation/functional layer application unit comprises a pressure applicator, wherein the steps comprise feeding a solid laminate from the functional layer supply and applying pressure with the pressure applicator prior to exposing the printing plate. The laminate supply unit may comprise a holder configured to hold a spool of laminate and the pressure applicator may comprises a roller, wherein the method comprises unspooling the laminate from the functional layer supply unit and laminating the functional layer onto the printing plate using the roller.

In embodiments comprising a second roller mounted adjacent the pressure applicator roller as described herein, the method comprising disposing the laminate between the pressure applicator roller and the second roller, providing the relative motion between the combined radiation and lamination unit and the printing plate, positioning the pressure applicator roller and second roller in a first configuration in which the pressure applicator roller axis is located ahead of the second roller axis in the first direction for at least a first time period, then repositioning the pressure applicator roller and second roller in a second configuration in which the second roller axis is located ahead of the pressure applicator roller axis in the first direction for a second time period, and cutting the laminate adjacent a trailing edge of the plate during the second time period. In embodiments in which the pressure applicator roller and second roller are mounted to a rack rotatable between the first configuration and the second configuration, the method comprises rotating the rack after the laminate is laminated to a trailing edge of the printing plate in the first direction.

Some method embodiments may also comprise a step of retrieving the solid laminate from the target surface onto a take-up unit after the one or more radiation sources and commonly located lamination unit traverse relative to the target. In such embodiments in which the method includes making multiple passes with the one or more radiation sources, the solid laminate may be wound and unwound between the functional layer supply and the take-up unit during each pass, and then rewinding the functional layer onto the functional layer supply from the take-up unit after the plurality of exposure steps. In embodiments in which the laminate take-up unit has a fixed position and the functional layer application unit has variable position, the solid laminate may be cut adjacent the trailing edge of the target after a first pass, the one or more radiation sources may then make multiple passes, and the solid laminate may be wound onto the take-up unit after a final pass.

In any of the methods described above, the combined radiation/functional layer application unit may be mounted to a movable carriage and the step of causing relative motion may comprise moving the carriage while the printing plate remains in a fixed position.

In yet another aspect of the invention, a combined radiation and functional layer application system may comprise one or more fixed radiation sources configured to emit radiation toward a surface of a moveable target having a leading edge and a trailing edge. A fixed coating unit commonly located with the one or more fixed radiation sources is configured to apply the functional layer in a liquid form over the surface of the moveable target as the target moves relative to the one or more fixed radiation sources and commonly located fixed coating unit. The target is configured to move past the one or more radiation sources and commonly located fixed coating unit in a first direction moving from the leading edge to the trailing edge while a fixed coating unit is positioned to apply the functional layer to the target ahead of the one or more radiation sources in the first direction. In a related method, a fixed combined radiation/coating unit as described above is provided, the printing plate is moved relative to the fixed combined radiation/coating unit with its surface oriented to receive radiation from the one or more radiation sources and the functional layer from the coating unit. The functional layer is applied over the printing plate surface from the coating unit, and then the printing plate is exposed through the functional layer to the radiation emitted from the one or more radiation sources while the printing plate moves past the combined radiation/coating unit.

Still another aspect of the invention comprises a method for preparing a printing plate including providing a combined radiation/functional layer application unit with one or more radiation sources configured to emit radiation and a functional layer application unit commonly located with the one or more radiation sources, in which the functional layer application unit comprises a functional layer supply unit configured to hold a supply spool of an oxygen-blocking functional layer in the form of a solid laminate. The combined radiation/functional layer application unit comprises a pressure applicator and a cutter. The pressure applicator comprises laminate disposed between a first roller and a second roller. The functional layer is disposed over the printing plate surface from the functional layer supply unit during relative motion between the printing plate and the combined radiation/functional layer application unit. Laminate is unspooled from a functional layer supply unit and laminated onto the printing plate, and the printing plate is exposed through the functional layer to the radiation emitted from the one or more radiation sources. The laminate is cut adjacent a trailing edge of the printing plate with a cutter. The first and second rollers are disposed in a first configuration in which the first roller axis is located ahead of the second roller axis in the direction of travel for at least a first time period, then repositioned in a second configuration in which the second roller axis is located ahead of the first roller axis in the direction of travel for a second time period, during which the laminate is cut. The first and second rollers may be mounted to a rack rotatable between the first configuration and the second configuration, wherein the method comprises rotating the rack after the laminate is laminated to a trailing edge of the printing plate in the first direction. Embodiments of the foregoing may include embodiments in which the plate is moving or stationary.

Still another aspect of the invention comprises a combined radiation and functional layer application system having one or more radiation sources and a functional layer application unit commonly located with the one or more radiation sources comprising a lamination unit configured to apply the functional layer as a solid laminate. The lamination unit comprises a laminate supply unit configured to feed the solid laminate over the target surface as the one or more radiation sources and commonly located lamination unit traverse relative to the target. The laminate supply unit comprises a holder configured to hold a spool of laminate with an axis of the spool of laminate disposed perpendicular to the first direction, and a pressure applicator configured to apply the solid laminate to the target surface as the one or more radiation sources and commonly located lamination unit traverse relative to the target. The pressure applicator comprises a first roller and a second roller, each roller having an axis disposed perpendicular to the first direction, the first and second rollers configured to receive the laminate therebetween during operation of the system and having a first configuration in which the first roller axis is located ahead of the second roller axis in the first direction, and a second configuration in which the second roller axis is located ahead of the first roller axis in the first direction. A cutter is configured to cut the solid laminate adjacent the trailing edge of the target. The one or more radiation sources and commonly located functional layer application unit are configured to move relative to the target in a first direction moving from the leading edge to the trailing edge, with the functional layer application unit positioned to apply the functional layer to the target ahead of the one or more radiation sources in the first direction. The first and second rollers may have different cross-sectional diameters, and may be mounted to a rack rotatable between the first configuration and the second configuration. The cutter preferably comprises at least one blade configured to travel in a direction perpendicular to the direction of relative travel between the plate and the combined radiation and functional layer application system. The plate may be configured to move or to remain stationary. In systems in which the plate is stationary, a laminate take-up unit may be located in a fixed position relative to the functional layer application unit and configured to retrieve the solid laminate from the target surface after the one or more radiation sources and commonly located lamination unit traverse relative to the target. The fixed position of the laminate take-up unit may be adjacent an input of a washing unit.

Yet another aspect of the invention comprises a combined radiation and functional layer application system with one or more LED UV radiation sources configured to emit radiation toward a top surface of a printing plate having a LAMS layer, a leading edge and a trailing edge. An oxygen blocking layer application unit is commonly located with the one or more radiation sources and is configured to dispose an oxygen-blocking layer over the surface of the LAMS layer. The functional layer is configured to be applied from the leading edge to the trailing edge during relative motion between the printing plate and the commonly located radiation sources and oxygen-blocking layer supply unit such that the functional layer is applied to the target ahead of the one or more radiation sources in the first direction. One or more radiation sources may be configured to emit radiation toward a back surface of the printing plate. The radiation/oxygen blocking layer application unit may move relative to a stationary plate or the plate may move relative to a stationary radiation/oxygen blocking layer application unit.

DETAILED DESCRIPTION OF THE INVENTION

Systems such as are currently found in the ESKO® XPS Crystal™ systems and as described in the '345 Publication lend themselves well to combination with systems for placing an oxygen barrier layer over the plate into an integrated system. The advantage of such systems over existing solutions is that the process of lamination and exposure may be combined in one apparatus such that the amount of machinery and the footprint for the equipment are reduced.

Figure 1A:
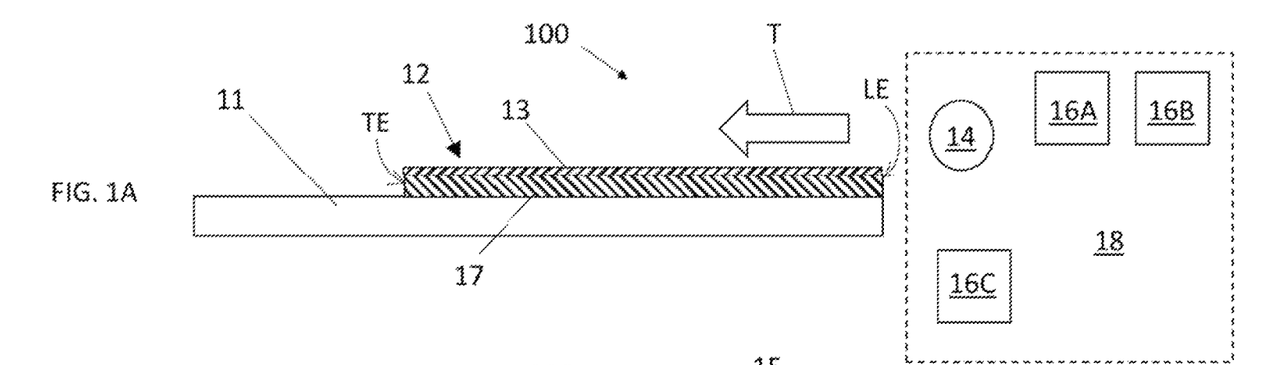
FIG. 1A is a schematic side view diagram of an exemplary combined radiation and functional layer application system.
Figure 1B:
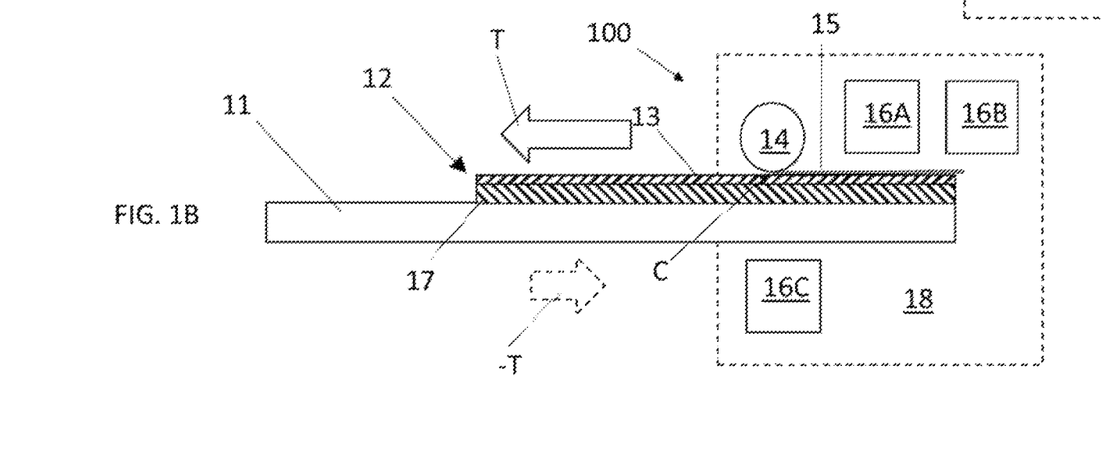
FIG. 1B is a schematic side view diagram of the system of FIG. 1A in the process of applying a functional layer and exposing a target to radiation.

As depicted schematically in FIGS. 1A and 1B, one exemplary embodiment of the invention comprises a system 100 comprising one or more radiation sources 16A, 16B, 16C and a functional layer application unit 14 commonly located with the one or more radiation sources in a combination radiation/functional layer application unit 18. The functional layer supply unit 14 is configured to dispose the functional layer 15 over the surface of a target 12, such as a printing plate comprising a polymer layer 17 that is reactive to the actinic radiation and a mask 13, such as a LAMS layer, during relative motion between the target 12 and the combination radiation/functional layer application unit 18. The term "functional layer" as used herein refers to any layer of material applied over a target, such as the printing plate, which has some function in the system. In the exemplary embodiments as discussed herein, the functional layer is preferably an oxygen barrier layer, but aspects of the invention are not limited to any particular type of functional layer. Each radiation source 16A, 16B, 16C is configured to emit radiation, such as radiation in the UV spectrum, toward a surface of a target 12, such as a printing plate. In preferred configurations, the printing plate 12 may be fixed on substrate 11, while the combination radiation/functional layer application unit 18 traverses in the direction of arrow T. The plate can be characterized as having a leading edge LE (which is first to receive radiation) and a trailing edge TE (which is last to receive the radiation).

Substrate 11 is preferably transparent to, or at least only partially blocks, the actinic radiation in at least an area that receives radiation from source 16C. For example, substrate 11 may comprise glass, such as a glass plate with a UV transmission of around 80% or higher, such as is a known property for iron free glass.

The functional layer application unit 14 is positioned to apply functional layer 15 to the plate 12 ahead of at least radiation sources 16A, 16B on the same side of the plate as the functional layer application unit. Radiation source 16C for providing back exposure may be aligned with a contact point C where the functional layer first contacts the plate, or it may be located upstream or downstream of that contact point in the direction of exposure motion. As used herein, the term "downstream" means in the direction of arrow T and "upstream" means in the direction opposite arrow T. Although top side radiation sources 16A and 16B are depicted in FIGS. 1A and 1B, it should be understood that only one such source, or more than two such sources, may be provided. Similarly, although only a single source is depicted for back exposure, multiple sources may be provided. It should be further understood that each source as depicted may comprise an array of LED point sources, and that each array may comprise a plurality of rows of sources extending across a width of the plate perpendicular to the direction of travel, and that the number of rows in each source may be the same or different. Each array may comprise LED point sources having a single wavelength or a mixture of LED point sources of different species each having a different nominal center wavelength.

Although generally described herein with reference to embodiments in which the plate is stationary and the combination radiation/functional layer application unit 18 is configured to move, in any of embodiments as described herein, the plate may be disposed on a moving substrate, and the substrate may move in the direction of arrow −T relative to a stationary combination radiation/functional layer application unit 18. Embodiments configured to apply a liquid coating may be particularly well suited for embodiments in which the plate is moved relative to a stationary combination radiation/functional layer application unit 18. The plate may be moved on, for example, a conveyor belt that is transparent and has perforations therein, such that any overspray of liquid may fall below As depicted in FIG. 1B, functional layer 15 is present on the surface of the plate only downstream of the contact point C. Functional layer application unit 14 may be any unit configured to place a functional layer of any type on a target of any type. Embodiments are described in more detail herein below in which the functional layer application unit 14 is configured to laminate a film onto the plate. The invention is not limited to such embodiments, however. In other embodiments, functional layer application unit 14 may comprise a unit for disposing a liquid layer onto the plate such as via spray coating or a coating unit that uses a doctor blade for spreading liquid disposed on the plate by any means. The liquid coating may be any type of coating known in the art and curable by any method known in the art, or may comprise a liquid that does not require curing to be an effective oxygen blocker. In some embodiments, the coating may be rapidly air curable such that it cures in the amount of time it takes for the combination unit 18 to move over a point on the plate the distance between application unit 14 and radiation unit 16A. In other embodiments, radiation unit 16A may be a radiation unit configured to cure the coating prior to application of radiation from source 16B.

Various means for causing relative motion between the combination radiation/functional layer application unit 18 and a plate are known, and the invention is not limited to any particular embodiment.

Figure 2A:
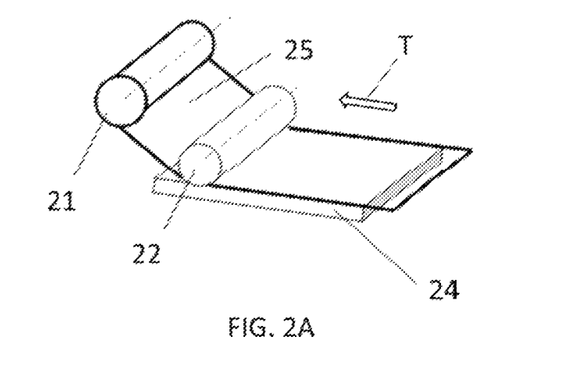
FIG. 2A is a schematic perspective diagram of an exemplary functional layer application unit portion applying a solid functional layer as a laminate.

More detailed embodiments of the functional layer application unit 14 will now be described. In one embodiment, shown in FIGS. 2 and 3, the functional layer application unit comprises a lamination unit, which typically has three general components: a reservoir spool 21 for the oxygen blocking foil 25, a pressure roller 22 to press the foil against the polymer plate 24, and a cutter 23 to cut off the foil from the reservoir after lamination. Spool-to-spool embodiments without a cutter are described herein later with reference to FIGS. 6A-7B. Rollers 21 and 22 have axes arranged perpendicular to the direction of motion T of roller 22 relative to the plate 25 (which relative motion may comprise roller 22 moving over a fixed plate in the direction of arrow T, or plate 25 moving in a direction opposite arrow T relative to a fixed roller 22). Cutter 23 may move in direction C, which is also perpendicular to the direction of relative motion T. Cutter 23 may comprise any means for cutting known in the art, and the depiction in FIG. 2A is intended only to be schematic in nature. However, suitable cutters may include a pair of blades configured to shear the foil between the blades, a single blade with a sharp edge facing in direction C, a laser, a heated blade, a roller blade, or the like. Mechanisms for moving a cutter across a film to cut it are well known in the art and are not detailed here.

Figure 2B:
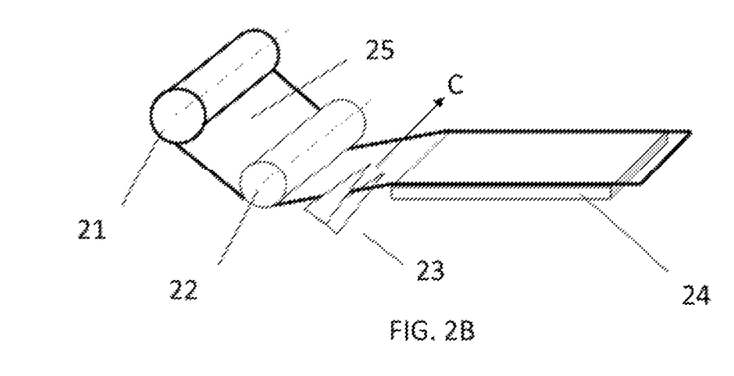
FIG. 2B is a schematic perspective diagram of the functional layer application unit of FIG. 2A in a cutting position.
Figure 3A:
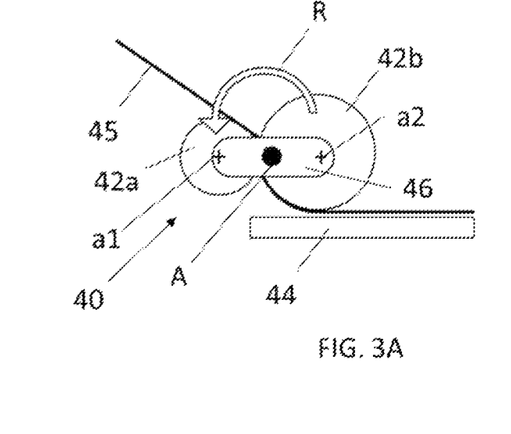
FIG. 3A is a schematic side view diagram of another exemplary functional layer application unit, having a pair of rollers, for applying a solid functional layer as a laminate, shown in a lamination configuration.
Figure 3B:
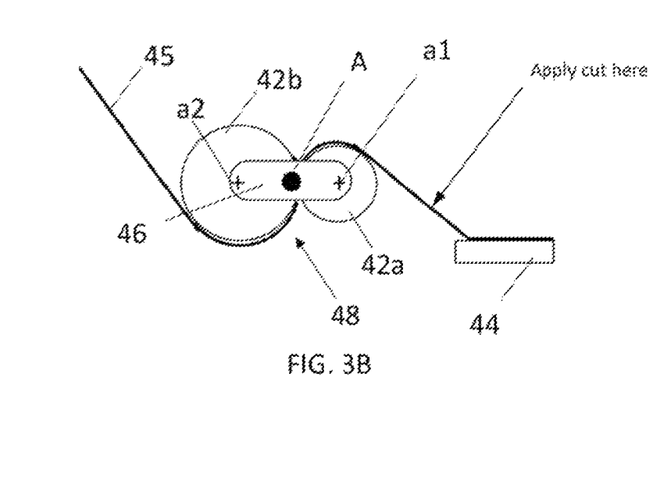
FIG. 3B is a schematic side view diagram of the functional layer application unit of FIG. 3A shown in a cutting configuration.

In the embodiment illustrated in FIGS. 3A and 3B, pressure roller 42B may have a relatively larger cross sectional diameter than a relatively smaller roller 42A disposed adjacent to it. The axes of the rollers (a1 for roller 42A, and a2 for roller 42B) are disposed parallel to one another, and the rollers are configured to receive the laminate therebetween during operation of the system. Both rollers may be mounted on a rack 46 configured to be turned 180° along arrow R about axis A (parallel to axes a1 and a2) from a laminating configuration 40 as depicted in FIG. 3A, to a cutting configuration 48 as depicted in FIG. 3B. In the laminating configuration 40, axis a1 of roller 42*a* is located ahead ("downstream") in the direction of arrow T of the axis a2 of roller 42*b* in the direction of travel of the lamination unit relative to the plate. In the cutting configuration 48, roller axis a2 of roller 42B is located ahead (downstream) of the axis a1 of roller 42A in the direction of travel. The dual roller system lifts the foil up from the polymer plate in the cutting configuration to provide easier access for cutting with the cutting tool. This type of system provides better control of the loose end of the oxygen blocking foil during the lamination process as compared to a single roller system. As noted in FIG. 2B relative to FIG. 2A, in systems with only a single roller 22, the roller may be configured to run at a first height relative to the surface of the plate 24, as depicted in FIG. 2A, and then dip to a second, relatively lower height as depicted in FIG. 2B, in order to complete a cutting step.

Figure 4:
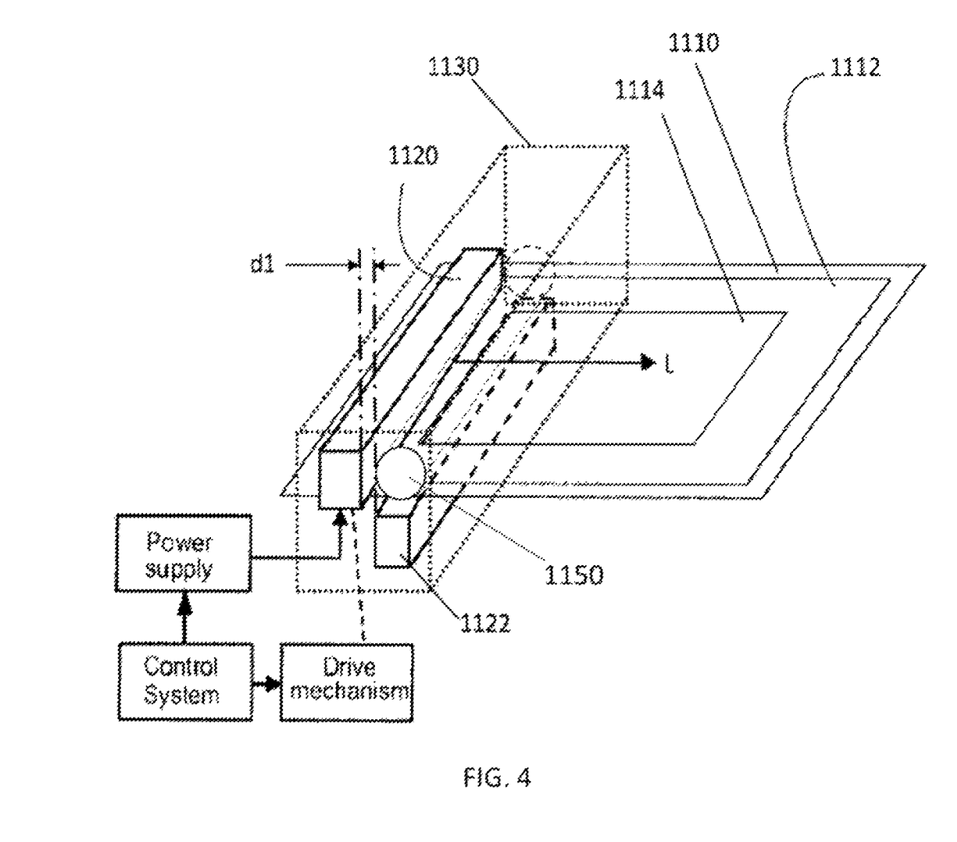
FIG. 4 is a schematic perspective diagram of an exposure head mounted on a carriage for exposing a printing plate.

The combination unit 18 as depicted in FIG. 1A may be embodied in the form of a carriage 1130 in the configuration shown in FIG. 4. Carriage 1130 may comprise a back side linear source 1122 arranged to irradiate the back side of a plate 1114 mounted on transparent surface 1112, such as a glass plate. A top side linear source 1120 (which although depicted schematically as a single source, may comprise two or more sources, as depicted in FIG. 1A) is arranged to irradiate the top side of the plate. The functional layer application unit 1150 is positioned downstream (in the direction of arrow L) of the top side linear source(s). Each linear source, and the functional layer application unit 1150, extends to cover one dimension of the plate, which in the example shown shall be referred to as the transverse direction. The carriage traverses the plate in the longitudinal (or lateral) direction along arrow L in at least a first pass, with at least one source, and preferably both sources, activated. While the exposure step may be performed in a single pass, in some embodiments the exposure may be performed in a plurality of passes, in which each pass imparts radiation using both banks of sources at a fraction of the total exposure needed to provide a desired amount of exposure. As will be understood, the carriage may have a first speed when traversing the plate along the direction of arrow L with radiation sources activated, and a second, faster speed when traversing the plate in the direction opposite arrow L, to reset for another pass or at the completion of the desired number of passes.

The overall mechanism for creating the exposure may comprise a table having an outer frame 1110 that holds a transparent (e.g. glass) inner portion 1112. The upper 1120 and lower 1122 linear radiation sources (e.g. banks of LED point sources, optionally mounted inside a reflective housing) are mounted on a gantry system or carriage 1130. Preferably, the trailing edge of light source 1122 and leading edge of light source 1120 are separated by a distance (d1) to provide a desired amount of time delay between back and front exposure.

The radiation sources are connected to a power source, such as an electrical power cord having sufficient slack to extend the full range of motion of the carriage. Tracks (not shown) disposed on the outer frame portion provide a defined path for the gantry system or carriage to traverse. The carriage may be moved on the tracks by any drive mechanism known in the art (also coupled to the power supply and the controller), including a chain drive, a spindle drive, gear drive, or the like. The drive mechanism for the carriage may comprise one or more components mounted within the carriage, one or more components fixed to the table, or a combination thereof. A position sensor (not shown) is preferably coupled to the carriage to provide feedback to the controller regarding the precise location of the carriage at any given time. The control signal output from the controller for operating the radiation sources and for controlling motion of the carriage may be supplied via a wired or wireless connection. The controller may be mounted in a fixed location, such as connected to the table with a control signal cable attached to the sources similar to the power cable, or may be mounted in or on the carriage. The control system and drive mechanism cooperate to cause back/forth relative motion in a transverse direction between the light from the radiation sources and the plate. If should be understood that other embodiments may be devised in which the drive mechanism is configured to move the portion of the table containing the plate past stationary upper and lower linear radiation sources, as well as embodiments in which the radiation sources cover less than the full width of the plate and are movable in both the transverse and longitudinal direction to provide total plate coverage (or the plate is movable in both directions, or the plate is movable in one of the two directions and the sources are movable in the other direction to provides the full range of motion required to cover the entire plate).

The control system, in addition to controlling the drive mechanism and the radiation sources, may also control the cutter and the functional layer application unit as described herein. Sensors (not shown specifically, but generally encompassed as part of the control system) mounted in the carriage may detect when the relevant portion of the layer application unit is disposed over the trailing edge of the plate and may thus cause the functional layer application unit to transition from a lamination configuration to a cutting configuration, such as in the manner as described herein, and then cause the cutter to cut the film. Similarly, in liquid application embodiments, the control system may control the flow of liquid to the liquid application system for supplying oxygen-blocking liquid to the plate.

Figure 5:
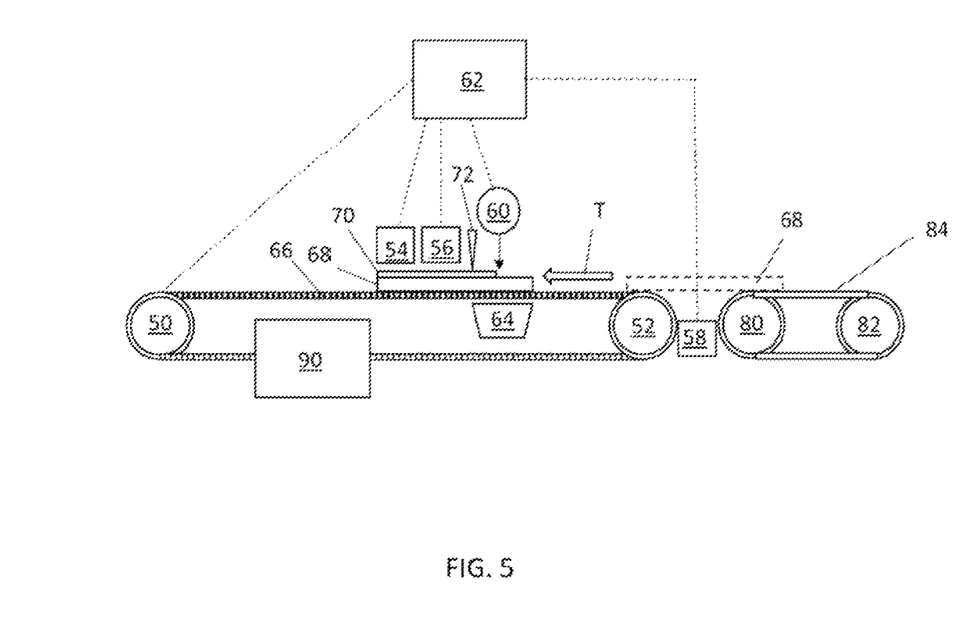
FIG. 5 is a schematic side view diagram of an exemplary combined radiation and functional layer application system liquid coating embodiment.

FIG. 5 depicts schematically a side view of another exemplary embodiment of the invention. In the system depicted in FIG. 5, the combination radiation/functional layer application unit comprises functional layer application unit 60 commonly located with the radiation sources 54, 56, 58. Plate 68 is disposed on a conveyor system comprising conveyor belt 66 and conveyor belt 84, which move the plate along the direction of arrow T past a fixed radiation/functional layer application unit. Plate 68 preferably has a LAMS layer (not shown) on a top surface thereof. Functional layer application unit 60 comprises a liquid applicator, such as a spray bar configured to spray an oxygen-blocking fluid in a layer 70 on the upper surface of the plate. In some embodiments, application unit 60 may dispose a stream (rather than a spray) of liquid on the plate and member 72 may be a doctor blade set a predetermined distance above the plate to spread the applied liquid in an even layer. In still other embodiments, member 72 may be configured to cure the applied oxygen blocking liquid by applying heat, air, actinic radiation at a wavelength that cures the oxygen blocking liquid but not the plate polymer, etc.

Conveyor 66 may be in the form of a grid or may have numerous perforations so that any excess liquid (such as pushed off the trailing edge of the plate) may pass through the conveyor into a disposal unit 64. Back exposure unit 58 is located upstream (opposite the direction of arrow T) of the functional layer application unit 60 in a gap between conveyor belts 84 and 66. Conveyor belt 66 is driven by drums 50 and 52 (one of which may be active, and the other of which may be passive, or both may be active), and conveyor belt 84 is likewise driven by drums 80 and 82. Controller 62 controls the speed of the conveyor 66 by controlling speed of the drums (although depicted as controlling only drum 50, it may control both drums 50 and 52, or only drum 52 instead), controls radiation exposure by controlling sources 52, 56, and 58 (which may be configured for variable intensities), and controls liquid application unit 60. Sensors configured to detect the trailing edge of plate 68 may be used for controlling when to apply the liquid. Power to the controller, the radiation sources, and the conveyor may be supplied by a power source (not shown). The liquid dispensed by application unit 60 may be supplied by a pump (not shown) or gravity flow from a reservoir (not shown) and may be controlled by one or more valves (not shown) that may be binary (on/off) and/or variable (to control flow within a range, which range may be dictated by the speed of the conveyor, depth of liquid desired, effectiveness of the liquid, and the like).

Although depicted in a configuration with two conveyors with the back exposure located upstream of the functional layer application point, in other embodiments a single conveyor may be used with the back exposure aligned with or located downstream of the functional layer application point. In such systems, it may also be desirable for the conveyor 66 to be transparent or suitably translucent to the back exposure radiation. It may be desirable in any liquid application based system to provide a cleaning station 90 for the conveyor belt in some portion of the belt travel after the plate is discharged from drum 50 and before a new plate is received on drum 52, to remove any overspray or otherwise undesired liquid present on the conveyor.

Figures 6A, 6B:
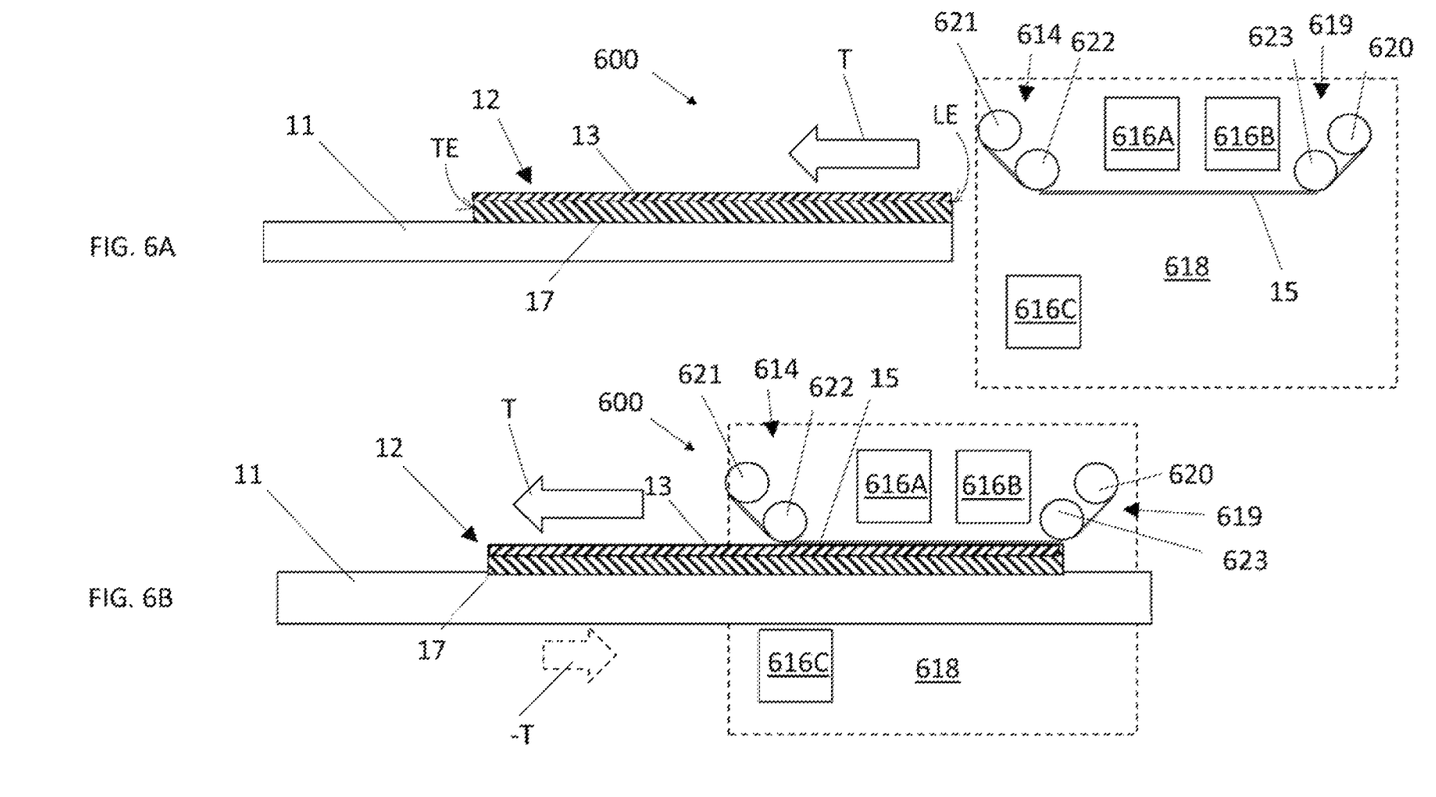
FIG. 6A is a schematic side view diagram of an exemplary combined radiation and spool-to-spool functional layer application system.
FIG. 6B is a schematic side view diagram of the system of FIG. 6A in the process of applying a functional layer and exposing a target to radiation.

Yet another embodiment is depicted in FIGS. 6A and 6B, which is similar to the system depicted in FIGS. 1A and 1B, except that in system 600, the functional layer 15 extends between the functional layer application unit 614 positioned ahead of radiation sources 616A, 616B and a functional layer take-up unit 619 positioned after the radiation sources (when traversing in the T direction). In the depicted embodiment, the system may continuously unwind the functional layer from spool 621, press it onto the plate with roller 622, and rewind it onto take-up spool 620. Optional pressure roller 623 may be positioned just ahead of take-up spool 620 to ensure that the functional layer does not lift off too early. For implementations that require multiple passes, spool 621 may unwind and spool 620 may wind when making a pass in the direction of arrow T, and spool 621 may wind and spool 620 may unwind the functional layer when making a pass in the opposite direction (in the −T direction). An optional back exposure radiation source 616C may also be present. The radiation sources and functional layer application and take-up units may all be included together in a moving combination unit 616. Because the foil is not cut, the foil may be used for several exposure steps on several different plates, in which case the foil may be rewound onto spool 621 from spool 620 after the completion of a first exposure step or series of exposure steps, before commencing the next exposure step or series of exposure steps. The spool may hold enough foil to handle multiple exposure steps (on multiple plates) before rewinding.

Figure 7A:
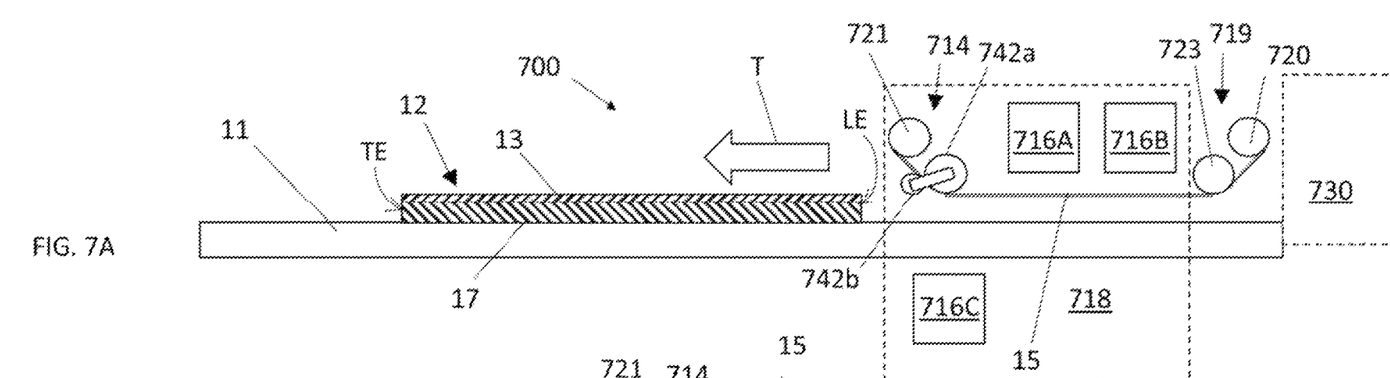
FIG. 7A is a schematic side view diagram of an exemplary combined radiation and spool-to-spool functional layer application system with one spool stationary.
Figure 7B:
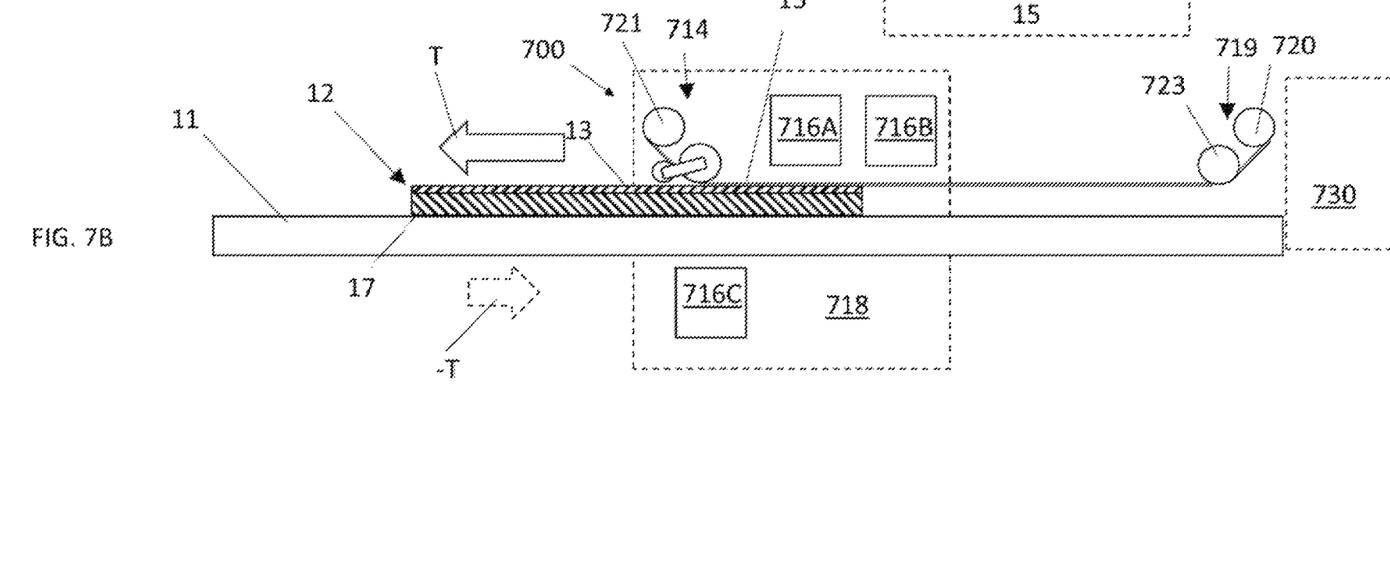
FIG. 7B is a schematic side view diagram of the system of FIG. 7A in the process of applying a functional layer and exposing a target to radiation.

In another embodiment, depicted in FIGS. 7A and 7B, system 700 comprises stationary take-up unit 719, comprising take-up spool 720 and roller 723, may be stationary behind the start positon of the moving combination unit 718, or example at the input of a washing unit 730. Moving combination unit contains sources 716A, 716B, and 716C and the foil application unit 714, comprising foil reservoir spool 721, pressure roller 742a, and adjacent roller 742b (with rollers 742a and 742b having functionality similar to 42a and 42b, as described herein with respect to FIGS. 3A and 3B). After the moving combination unit 718 makes a first pass, the foil may be cut, to permit subsequent passes in the T and −T directions, without further disturbing the foil. Stationary take-up unit 719 may then be used to peel off and store away the used foil from the plate after a multitude of exposure steps, before the plate is moved into the washing unit 730.

Figures 8A, 8B:
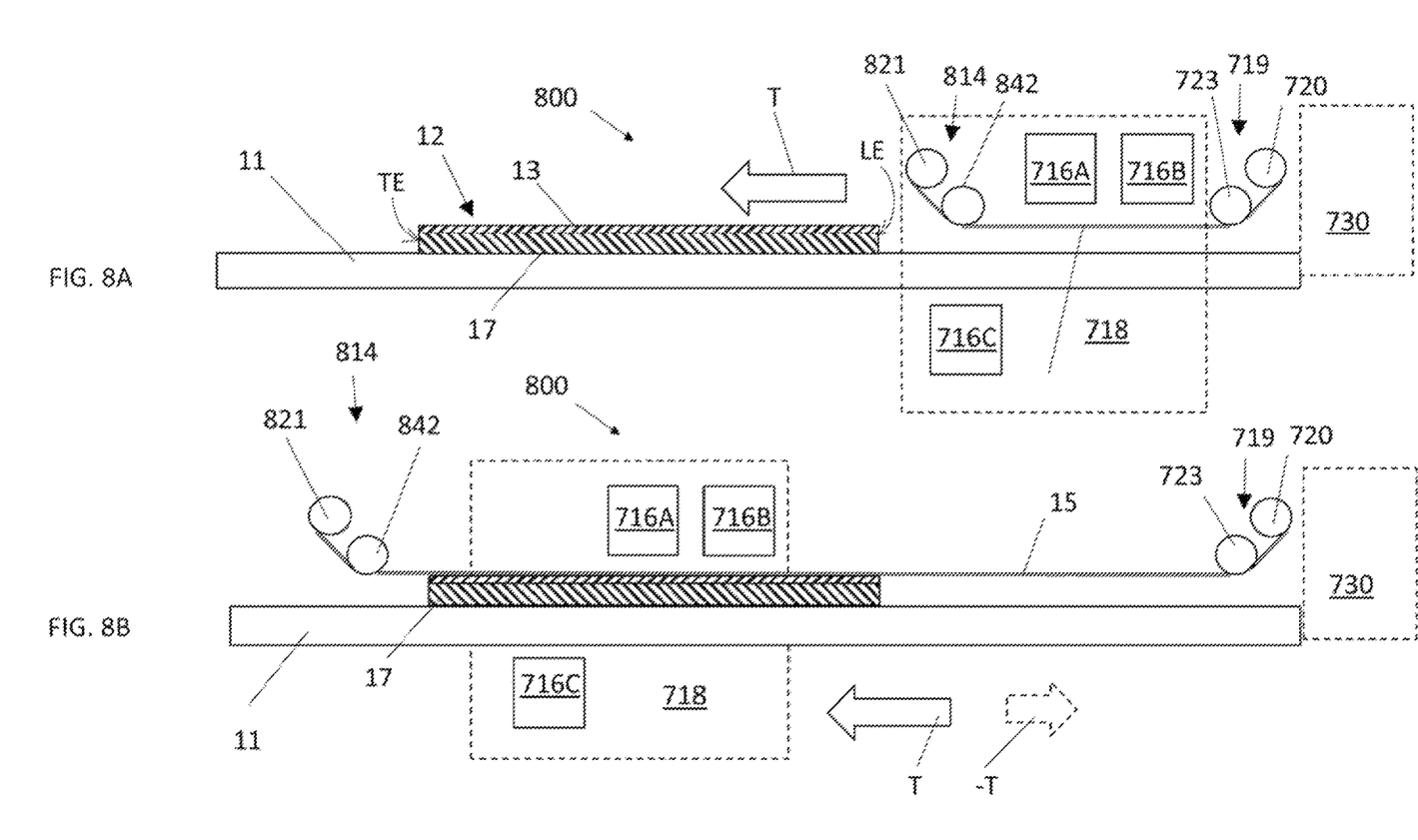
FIG. 8A is a schematic side view diagram of an exemplary combined radiation and spool-to-spool functional layer application system with one spool stationary and one spool moving prior to being positioned in a temporary stationary location.
FIG. 8B is a schematic side view diagram of the system of FIG. 8A in the process of applying a functional layer and exposing a target to radiation, with both spools in their stationary locations.

In yet another embodiment, depicted in FIGS. 8A and 8B, all of the components similarly numbered may be essentially the same as disclosed with respect to FIGS. 7A and 7B, except the foil application unit 814 may comprise only foil reservoir spool 821 and pressure roller 842. During use of this embodiment, foil 15 is not cut at the end of the first pass, but instead, as depicted in FIG. 8B, the foil application unit 814 is dropped off at a stationary location at the end of the first pass in a location downstream of the trailing edge of the plate. Accordingly, the foil remains stationary on both ends of the plate through a plurality of exposure step passes in the T and −T direction, and then the roller is picked up again on the last pass in the T direction, and the foil is then removed from the plate during the final pass in the −T direction. Thus, the system secures the functional layer application unit in the temporary stationary position after a foil application pass, conducts one or more exposure passes after the foil application pass, and then retrieves the functional layer application unit following a final exposure pass. After the exposure step for a first plate, the foil may then be used again for the exposure steps of one or more additional plates. At the end of a predetermined number of exposure steps or plates, the foil may be wound spool-to-spool between reservoir spool 821 and take-up spool 720 to position "fresh" foil for use in a subsequent exposure. While spool 821 is referred to as a reservoir spool and spool 720 as a "take-up" spool in this and various other embodiments, it should be understood that the functions of the spools may be reversed with respect to which roll supplies the "fresh foil." While it may be more convenient for spool 821 to have fresh foil and spool 720 to have used foil, a system may be implemented such that spool 821 takes a predetermined amount of fresh foil needed from spool 720 in a foil winding step so that it can cover the full expanse of the plate with fresh foil for a subsequent set of exposure steps.

Any of the rollers configured to apply downward pressure to press the foil onto the plate (i.e. rollers 22, 42a/42b, 622, 623, 742a/742b, 723, 842) may be configured to be raised or lowered up and down (perpendicular to arrow T) as needed to permit the plate to pass underneath the respective units when moving from the exposure step to a washing step in a workflow.

Notably, none of the units shown herein is to scale. In particular, the distance between the back exposure radiation source (e.g. 58, 16C) and the front exposure radiation sources (e.g. 54/56, 16A/16B) in combination with the speed of travel of the plate (in the system depicted in FIG. 5) or of the carriage (in the system depicted in FIGS. 1A and 1B may be set (and may be adjustable) to provide a desired delay time between the back exposure and the front exposure steps. Furthermore, although depicted with a fluid functional layer application unit in combination with a moving plate in FIG. 5 and a solid functional layer application unit in combination with a fixed plate in FIGS. 1A and 1B, it should be understood that either type of functional layer application may be used in combination with either fixed plate or moving plate systems.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A combined radiation and functional layer application system comprising:
    one or more radiation sources, the one or more radiation sources configured to emit radiation toward a surface of a fixed target, the fixed target having a leading edge and a trailing edge,
    a functional layer application unit commonly located with the one or more radiation sources, the functional layer application unit configured to dispose a functional layer over the surface of the fixed target as the one or more radiation sources and commonly located functional layer application unit traverse relative to the target, the functional layer application unit comprising a lamination unit configured to apply the functional layer as a solid laminate, the lamination unit comprising:
        a laminate supply unit configured to feed the solid laminate over the target surface as the one or more radiation sources and commonly located lamination unit traverse relative to the target; and
        a pressure applicator configured to apply the solid laminate to the target surface as the one or more radiation sources and commonly located lamination unit traverse relative to the target;
        a cutter configured to cut the solid laminate adjacent the trailing edge of the target; and
        a second roller adjacent the pressure applicator roller and having an axis parallel to the pressure applicator roller axis, the pressure applicator roller and second roller configured to receive the laminate therebetween during operation of the system and having a first configuration in which the pressure applicator roller axis is located ahead of the second roller axis in the first direction, and a second configuration in which the second roller axis is located ahead of the pressure applicator roller axis in the first direction.

2. The combined radiation and lamination system of claim 1, wherein the laminate supply unit comprises a holder configured to hold a spool of laminate.

3. The combined radiation and lamination system of claim 2, wherein holder for the spool of laminate has an axis disposed perpendicular to the first direction.

4. The combined radiation and lamination system of claim 1, wherein the pressure applicator comprises a roller.

5. The combined radiation and lamination system of claim 4, wherein the pressure applicator roller has an axis disposed perpendicular to the first direction.

6. The combined radiation and lamination system of claim 1, wherein the pressure applicator roller and the second roller have different cross-sectional diameters.

7. The combined radiation and lamination system of claim 1, wherein the pressure applicator roller and the second roller are mounted to a rack, and the rack is rotatable between the first configuration and the second configuration.

8. The combined radiation and lamination system of claim 7, wherein the rack is rotatable by at least 180 degrees.

9. The combined radiation and lamination system of claim 1, wherein the cutter comprises at least one blade configured to travel in a second direction different from the first direction.

10. The combined radiation and lamination system of claim 9, wherein the second direction is perpendicular to the first direction.

11. The combined radiation and lamination system of claim 1, wherein the one or more radiation sources comprises a bank of UV LED sources arranged in a linear configuration perpendicular to the first direction.

12. A combined radiation and functional layer application system comprising:
    one or more radiation sources, the one or more radiation sources configured to emit radiation toward a surface of a fixed target, the fixed target having a leading edge and a trailing edge,
    a functional layer application unit commonly located with the one or more radiation sources, the functional layer application unit configured to dispose a functional layer over the surface of the fixed target as the one or more radiation sources and commonly located functional layer application unit traverse relative to the target, the functional layer application unit comprising a lamination unit configured to apply the functional layer as a solid laminate, the lamination unit comprising:
        a laminate supply unit configured to feed the solid laminate over the target surface as the one or more radiation sources and commonly located lamination unit traverse relative to the target; and
        a pressure applicator configured to apply the solid laminate to the target surface as the one or more radiation sources and commonly located lamination unit traverse relative to the target; and
        a laminate take-up unit configured to retrieve the solid laminate from the target surface after the one or more radiation sources and commonly located lamination unit traverse relative to the target; and
    means for causing relative movement between the fixed target and the one or more radiation sources and commonly located functional layer application unit in a first direction moving from the leading edge to the trailing edge of the target, the functional layer application unit positioned to apply a functional layer to the target ahead of the one or more radiation sources in the first direction.

13. The combined radiation and lamination system of claim 12, further comprising a second pressure applicator positioned between a trailing radiation source and the laminate take-up unit for keeping the functional layer in contact with a LAMS layer upstream of the take-up unit.

14. The combined radiation and lamination system of claim 12, wherein the laminate take-up unit has a fixed position relative to the functional layer application unit.

15. The combined radiation and lamination system of claim 14, wherein functional layer application unit has variable position.

16. The combined radiation and lamination system of claim 15, further comprising a cutter configured to cut the solid laminate adjacent the trailing edge of the target.

17. The combined radiation and lamination system of claim 14, wherein the functional layer application unit has variable position and a temporary stationary position, the temporary stationary position located downstream of the trailing end of the fixed target, wherein the system is configured to secure the functional layer application unit in the temporary stationary position after a functional layer application pass, conduct one or more exposure passes after the functional layer application pass, and then retrieve the functional layer application unit following a final exposure pass.

18. The combined radiation and lamination system of claim 12, wherein the means for relative movement between the fixed target and the one or more radiation sources and commonly located functional layer application unit in the first direction moving from the leading edge to the trailing edge of the target comprises a movable carriage to which the one or more radiation sources and the functional layer application unit are mounted.

19. The combined radiation and lamination system of claim 12, wherein the laminate supply unit comprises a holder configured to hold a spool of laminate.

20. The combined radiation and lamination system of claim 19, wherein holder for the spool of laminate has an axis disposed perpendicular to the first direction.

21. The combined radiation and lamination system of claim 12, wherein the pressure applicator comprises a roller.

22. The combined radiation and lamination system of claim 21, wherein the pressure applicator roller has an axis disposed perpendicular to the first direction.

23. The combined radiation and lamination system of claim 16, wherein the cutter comprises at least one blade configured to travel in a second direction different from the first direction.

24. The combined radiation and lamination system of claim 23, wherein the second direction is perpendicular to the first direction.

25. The combined radiation and lamination system of claim 12, wherein the one or more radiation sources comprises a bank of UV LED sources arranged in a linear configuration perpendicular to the first direction.

* * * * *